United States Patent [19]

Boudon et al.

[11] Patent Number: 5,023,478

[45] Date of Patent: Jun. 11, 1991

[54] COMPLEMENTARY EMITTER FOLLOWER DRIVERS

[75] Inventors: Gerard Boudon, Mennecy; Pierre Mollier, Boissise Le Roi, both of France; Seiki Ogura, Hopewell Junction, N.Y.; Dominique Omet, Evry, France; Pascal Tannhof, Perthes, France; Franck Wallart, Cesson, all of France

[73] Assignee: International Business Machines Corporation, Armonk, N.Y.

[21] Appl. No.: 493,079

[22] Filed: Mar. 13, 1990

[30] Foreign Application Priority Data

Mar. 14, 1989 [EP] European Pat. Off. ........ 89480046.5

[51] Int. Cl.$^5$ ................. H03K 19/092; H03K 19/013; H03K 19/017; H03K 19/086

[52] U.S. Cl. ........................ 307/446; 307/455; 307/456; 307/475; 307/255; 307/443; 307/544; 307/558; 307/547

[58] Field of Search ............... 307/446, 443, 455, 456, 307/458, 475, 570, 542, 572, 270, 544, 551, 547–549, 558, 255, 270

[56] References Cited

U.S. PATENT DOCUMENTS

| | | | |
|---|---|---|---|
| 4,038,607 | 7/1977 | Schade, Jr. | 330/13 |
| 4,159,450 | 6/1979 | Hoover | 330/264 |
| 4,618,782 | 10/1986 | Lang et al. | 307/255 |
| 4,818,893 | 4/1989 | Domnitz | 307/255 X |
| 4,845,385 | 7/1989 | Ruth, Jr. | 307/446 |
| 4,945,262 | 7/1990 | Piasecki | 307/475 X |
| 4,948,994 | 8/1990 | Akioka et al. | 307/446 X |

FOREIGN PATENT DOCUMENTS 2046357 4/1971 Fed. Rep. of Germany .
62-58718 8/1987 Japan .

OTHER PUBLICATIONS

IBM Technical Disclosure Bulletin, vol. 29, No. 4, Sep. 1986, pp. 1857–1858, entitled "Complementary FET Bipolar Circuit".

Primary Examiner—Stanley D. Miller
Assistant Examiner—David R. Bertelson
Attorney, Agent, or Firm—Otho B. Ross

[57] ABSTRACT

The present invention relates to fast complementary emitter follower drivers/buffers to be used in either a CMOS or pure complementary bipolar environment. The output driver (22) comprises top NPN and bottom PNP output transistors (T1, T2) with a common output node (N) connected therebetween. A terminal (15) is connected to the said output node (N) where the output signal (VOUT) is available. The pair of bipolar output transistors is biased between the first and second supply voltages (VH, GND). The output driver is provided with a voltage translator circuit (S) connected between the base nodes (B1, B2) of the output transistors (T1, T2). Logic signals (IN1, IN2), supplied by a preceding driving circuit (21), are applied to said base nodes. According to the invention, the voltage translator circuit (S) comprises two diodes (D1, D2) connected in series, preferably implemented with a main bipolar transistor having a junction shorted by a diode connected transistor to form a Darlington-like configuration. As a result, the voltage shift VS between the base nodes is selected to have the said output transistors operating at an operating point which ensures minimum delay and power consumption. In a typical bipolar technology, VS is made to be approximately equal to 1.5V. Additional features comprise the connection of a capacitor (C) between the base nodes and resistances (R1, R2) to the base nodes. The preceding driving circuit may be a CMOS logic gate or an ECL logic circuit.

18 Claims, 6 Drawing Sheets

COMPLEMENTARY EMITTER FOLLOWER DRIVERS

The present invention relates to Complementary Emitter Follower output stages and more particularly to an improved voltage translator circuit connected between the bases of the output bipolar transistors to achieve faster transients on the output signal.

Figure 1A:
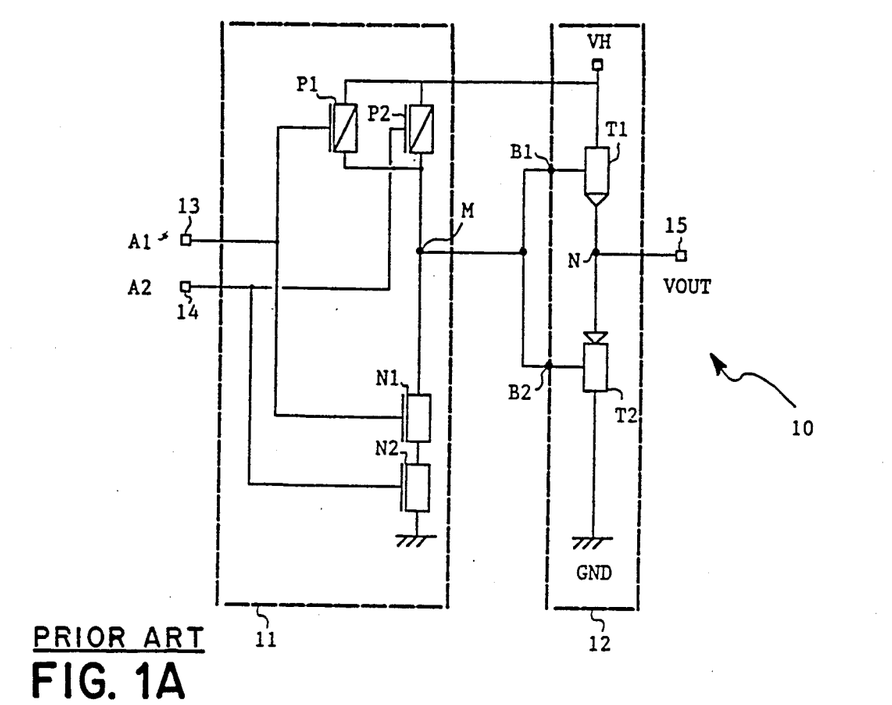
FIGS. 1A and 1B illustrate a conventional CEF driver in a BICMOS ICL environment.

Complementary Emitter Follower (CEF) output stages built with complementary bipolar transistors to improve intrinsic driving capability have been previously described in the literature. For example, in Ref. 1: U.S. Pat. No. 3,541,353 assigned to Motorola and Ref. 2: U.S. Pat. No. 4,289,978 assigned to IBM, there is described a complementary emitter follower driver in a BICMOS and pure complementary bipolar environment, respectively. In the first cited reference, this driver essentially consists of a top NPN pull up transistor in series with a bottom PNP pull down transistor, forming the driving output stage, and of a single CMOS inverter in the preceding stage to perform the desired logic function. This combination of top NPN/bottom PNP transistors connected in an Emitter Follower (EF) configuration in a BICMOS environment, is typical of the so called Integrated Complementary Logic (ICL) technology. The schematic of such a conventional ICL driver circuit performing a NAND logic function, is shown in FIG. 1A of the present application. Circuit 10 is based on a CMOS logic gate block 11 which performs the logic function, followed by a driving block 12 of the CEF type comprised of top NPN bottom PNP bi-polar transistors T1 and T2, respectively connected to a first supply voltage VH and a second supply voltage GND. The logic gate block 11 comprises four FETs P1, P2, N1 and N2 connected between VH and GND, driven by logic input signals A1 and A2, which are applied through terminals 13, 14. The output signal supplied by block 11 at node M is applied to the base nodes of transistors T1 and T2, respectively referenced B1 and B2. The circuit output signal VOUT is available at terminal 15 which is at the same potential as the common output node N formed between the emitter regions of transistors T1 and T2. The circuit depicted in FIG. 1A is a 2 input NAND gate, but circuits performing other logical functions can be built as well. The circuit of FIG. 1A has some inconveniences caused by this direct interconnection of base regions of the pair of bipolar transistors T1 and T2. Normally one transistor is ON when the other is OFF and vice versa, because the same signal at node M is applied to complementary bipolar transistors. However, there is a performance degrading "dead zone" for input voltages within the VBE (T1)+VBE (T2) range, because one bipolar device turns OFF well before the other turns ON. As a result, the CEF driver cannot be operated until the voltage swing of the output signal applied to nodes B1 and B2 is above VBE (T1)+VBE (T2). The switching is therefore delayed, which in turn, slows the response speed.

As recognized in the first cited above U.S. patent, it is very important to have the lowest possible impedance between the base regions, to have the potential of the bases changing at the same time. But, the use of a short circuit is by far unsatisfactory from a response speed stand point as explained above, which still remains an unsolved problem. It is therefore, highly desirable to limit the undesired effects of the dead zone to increase speed.

Figure 1B:
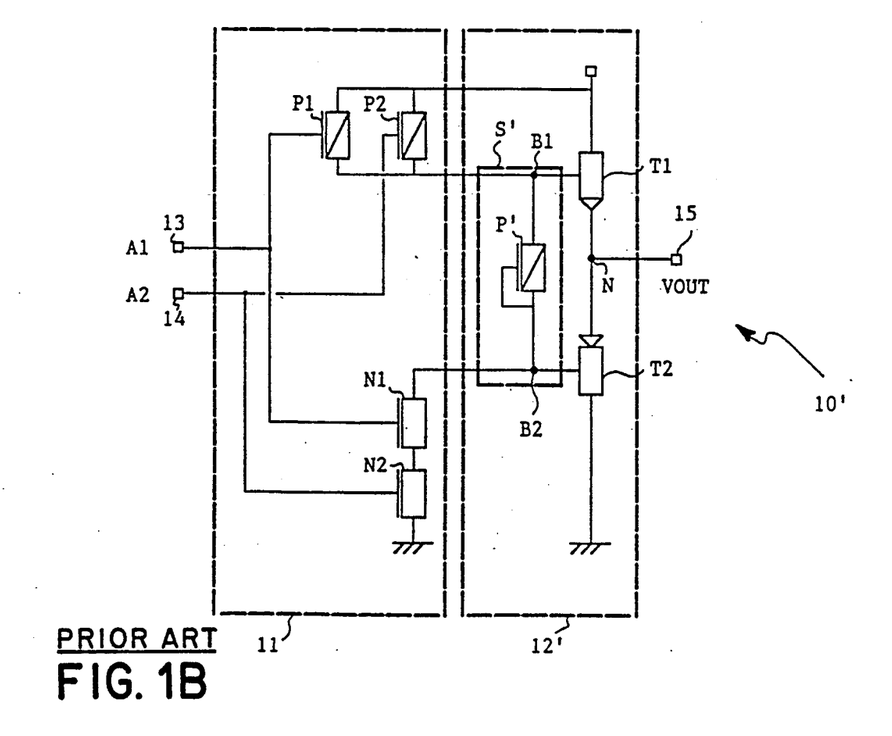

A solution in the CMOS environment is described in Ref. 3: IBM Technical Disclosure Bulletin, Vol. 29 No. 4, September 1986, pp 1857-1858 in an article entitled: "Complementary FET Bipolar Circuit." by F. A. Montegari. This circuit referenced 10' is shown in FIG. 1B of the present application. With respect to FIG. 1A, the same elements have the same references. As apparent from the drawing, the base nodes B1 and B2 of the top NPN and bottom PNP output transistors T1 and T2 are separated by a voltage translator circuit S' which essentially consists of a PFET referenced P'. In circuit 10', the PFET P' is aimed to be used as a diode, and thus the voltage swing of each base node is reduced by a voltage drop VGS, that corresponds to the voltage threshold in DC, VT=1 V for the PFET. In other words, PFET P' operates like a bias placed between the bases of transistors T1 and T2 for voltage translations; to produce faster turn-on of the emitter follower when transition takes place. It partially suppresses the "dead zone" mentioned above. However, the improvement is not satisfactory because the PFET P' has a high series resistance and the differential voltage VB1–VB2 across the base nodes can equal and even easily exceed the two VBEs of the NPN and the PNP transistors. As a consequence, a cross over current ICO can flow through the said output transistors during the transitions. In addition, there is no correlation between the VBE of the bipolar transistors and the threshold voltage VT of the FET. VT is quite dependent on the process parameters, temperatures, etc. Because VT=1 V, the reference voltage between the base nodes is more than one VBE (0.8 V), but its upper limit is above 2 VBEs and cannot be accurately determined in the AC mode.

Figure 2A:
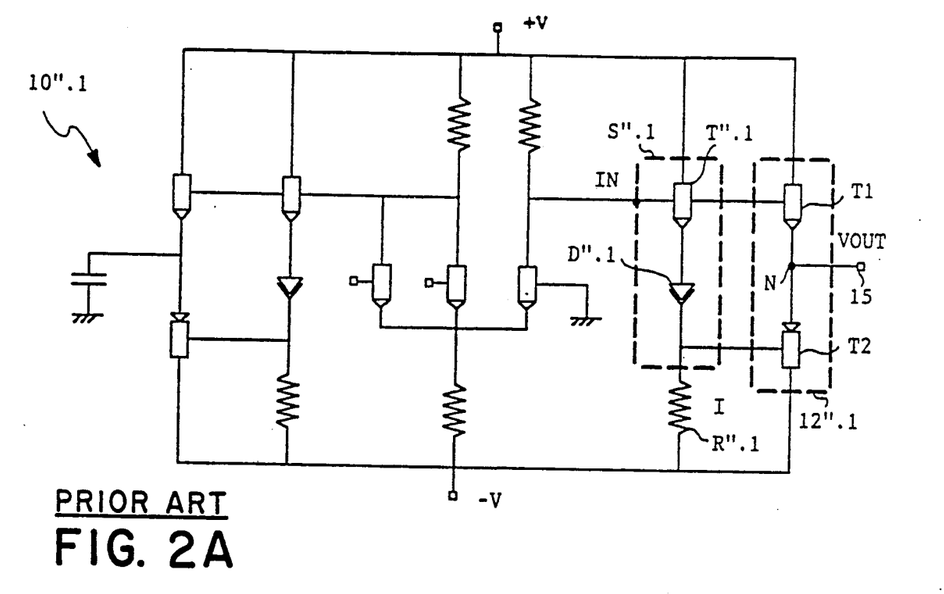
FIGS. 2A and 2B illustrate a conventional CEF driver in an ECL environment.

Another solution in the pure complementary bipolar environment, and more particularly in Emitter Coupled Logic (ECL) environment is given in U.S. Pat. No. 4,289,978 mentioned above as Ref. 2. Note that, a quite identical solution was disclosed in an article published in the IBM Technical Disclosure Bulletin, Vol 22, No. 8A, January 1980, page 3223, "Complementary Emitter Follower Driver" authored by J. A. Dorler et al. The schematic circuit of this solution is shown in FIG. 2A of the present application. Circuit 10".1 is of the single-ended type with one logic signal IN that is supplied by the ECL gate and applied on the bases of two NPN transistors T".1 and T1. A current source circuit supplying a constant current I is connected to the base of T2. The output signal VOUT is available at terminal 15. The NPN transistor T1 is directly driven by the input signal applied to its base. The PNP transistor T2 is driven through the said NPN transistor T".1 connected in series with a Schottky diode D".1. The PNP transistor is nominally held off and conducts only on negative-going input signal transitions to discharge the (capacitive) load. The NPN transistor of the pair of transistors conducts only on positive-going input signal transitions to charge the load. The essential purpose of NPN transistor T".1, connected in EF configuration, is to properly convey the logic signal IN to the base of the PNP transistor T2. Incidentally, it provides a DC voltage shift VS between the base nodes B1 and B2 and this combination may be seen as forming a voltage translator circuit S".1. Because the voltage drop across a SBD is much less than across a standard PN diode, e.g. 0.6 V vs 0.8 V, the voltage across the two base nodes is determined by the voltage shift VS that is imposed by the voltage translator circuit S".1. This circuit S".1 only offers a partial solution to the problem mentioned above. First, this solution is not optimized because the voltage applied between the base nodes is not appropriate; it has a low cross overcurrent but it cannot be rated good from a delay standpoint, as will be demonstrated later. Secondly, circuit 10".1 is only appropriate in the ECL environment when used as a single ended circuit, (the CEF driver 12".1 is driven by a single logic signal IN). Unfortunately, circuit S".1 is unusable in a BIC-MOS environment, because it would not work properly during down going transitions. In BICMOS ICL, the pull down is made by "ON" NFETs (e.g. N1 and N2 in FIG. 1B) connected between base and collector of the PNP transistor T2. Because transistor T".1 is connected in EF configuration, it would come in series with the NFETs and isolate node B2 from node B1. As a result, the base of transistor T2 is thus very slowly pulled down, which in turn produces very slow down going transitions and causes a very high cross-over current ICO. In addition, the usage of a SBD in the circuit causes a problem wherever the technology does not provide SBDs in the menu. SBDs need additional processing steps which lower the manufacturing yields and SBDs do not have good voltage tracking with VBEs of the bipolar transistors.

Figure 2B:
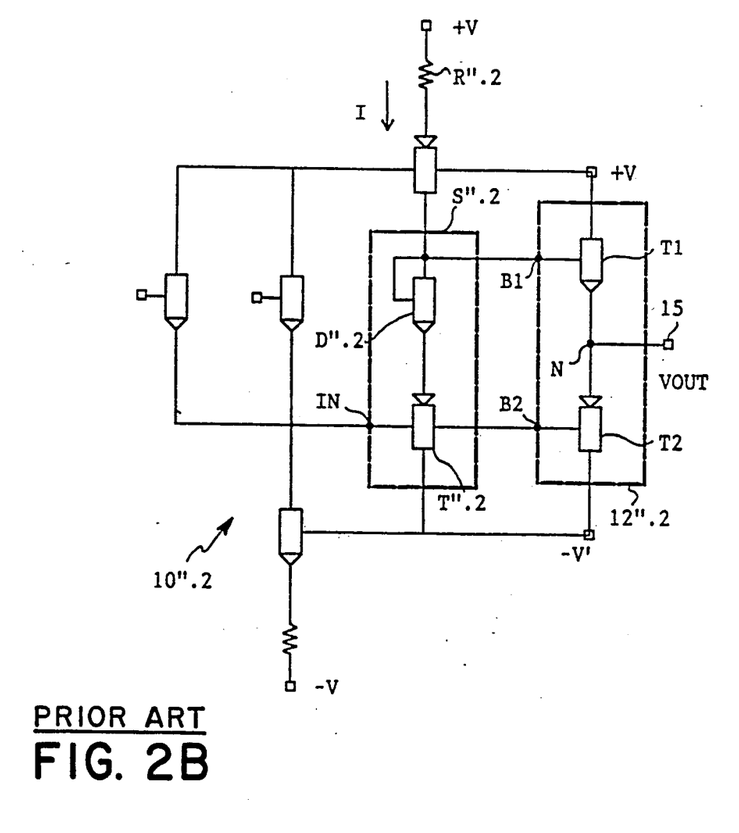

Still another solution in the ECL environment is shown in Ref. 4: U.S. patent application No. 308,469 assigned to the same assignee as of the present invention. The circuit referenced 10".2 shown in FIG. 2B of the present application is extracted from said Ref. 4. As far as the CEF driver 12".2 is concerned, two differences may be noticed. Firstly, the single logic signal IN is applied to the bases of the bottom transistor T2 and of transistor T".2, in a similar but symmetric operation, when compared to circuit 12".1 of FIG. 2A. Secondly, a diode connected transistor D".2 is used instead of the SBD D".1. In operation, the D.C. offset of two VBEs provided between the bases of transistors D"2 and T"2 match the corresponding offset required between the bases of transistors T1 and T2. Accordingly, the quiescent voltage at the emitters of the input transistor pair is set so that transistors T1 and T2 are simultaneously placed at such a threshold of conduction that a very high cross-over current ICO is produced, as demonstrated later. However, due to the presence of a diode connected NPN transistor in series with the base-emitter junction of a PNP transistor, the tracking is excellent.

None of the above solutions appears to be satisfactory in all respects, say they all leave unsolved problems as to the existence of a performance degrading "dead zone" and cross-over current which causes undesired power consumption.

Therefore, it is a primary object of the present invention to provide an improved voltage translator circuit to CEF drivers for optimized operation of the bipolar transistors that are put at a limit of conduction, but not at their respective thresholds of conduction for increased speed and reduced power consumption.

It is another object of the present invention to provide an improved voltage translator circuit to CEF drivers that allows the bipolar transistors to operate at a minimum cross-over current for reduced power dissipation and with a minimum of delay.

It is another object of the present invention to provide an improved voltage translator circuit to CEF drivers that eliminates the dead zone and permits to switch the bipolar transistors of the driving stage with a smaller input signal to increase speed for same output signal.

It is still another object of the present invention to provide an improved voltage translator circuit to CEF drivers that makes them independent of the circuit technology environment used.

It is yet still another object of the present invention to provide embodiments of an improved voltage translator circuit to CEF drivers that do not use SBDs.

The proposed improvements essentially consist in modifying the elements in the conventional voltage translator circuits that provide the DC voltage shift between the bases of the NPN and PNP output transistors. For an optimized operation, the desired value VS of that voltage shift is such that it should place the said output transistors in a slightly conducting state at an operating point that ensures both the lowest cross-over current and the lowest delay. These conditions result in turn, in minimizing the power loss due to the cross-over current and the delay loss due to turn-on transient time.

According to the present invention, it is essential to have a determined and fixed reference voltage shift between the two bases of the NPN and PNP output transistors for optimized operation. Experiments have shown that this voltage shift must be slightly less than two VBEs of a determined quantity. With a conventional bipolar transistor and in normal operation, the base-emitter voltage VBE is about 0.8 V; it has been demonstrated that the optimal value for VS is about 1.5 V. To achieve this goal, different configurations figurations of a voltage translator circuit, based on a diode-connected transistor in series with the base of a bipolar transistor, the so-called main transistor, to produce the said desired 1.5 V voltage shift, may be envisioned. In one preferred embodiment, the said voltage shift of about 1.5 V is obtained by connecting the main NPN transistor between the two base nodes of the output transistors. The collector and emitter electrodes are respectively connected to the bases of the top and bottom output transistors. A diode-connected NPN transistor is mounted in parallel with the collector-base junction of the said main NPN transistor, so that both transistors are mounted in a Darlington-like configuration between the base nodes. In other words, the current produced by this diode-connected NPN transistor is used to drive the base of the NPN transistor. Therefore, the voltage shift VS results from the voltage drops created in the emitter-base junction of the NPN main transistor in series with the diode-connected NPN transistor. This construction gives a voltage shift of about 100 mV smaller than the voltage shift provided by two diode connected transistors, merely connected in series. This is because the diode-connected transistor carries a current beta times smaller (beta being the collector to base current ratio of the main transistor, normally $50 < \beta > 100$, a typical value is $\beta = 80$), than the current flowing in the main transistor. With this construction, the impedance of the voltage translator circuit is as low as possible, so that the two base nodes are changing at the same time. To build the translator circuit from complementary bipolar transistors is a preferred solution to ensure the best tracking.

Preferably, a resistor is connected to each base of the NPN and PNP output transistors to adjust the value of the DC current flowing through the diodes in the quiescent state. Finally, a further improvement can be obtained when a large capacitor is connected between the two base nodes of the bipolar output transistors, so that in AC mode the signal supplied by the logic block is simultaneously applied to both base nodes.

None of the previous prior art solutions being satisfactory, applicant's inventors have envisaged the influence of the voltage shift VS on both normalized delay and power of the BICMOS ICL circuit 10' of FIG. 1B.

Figure 3:
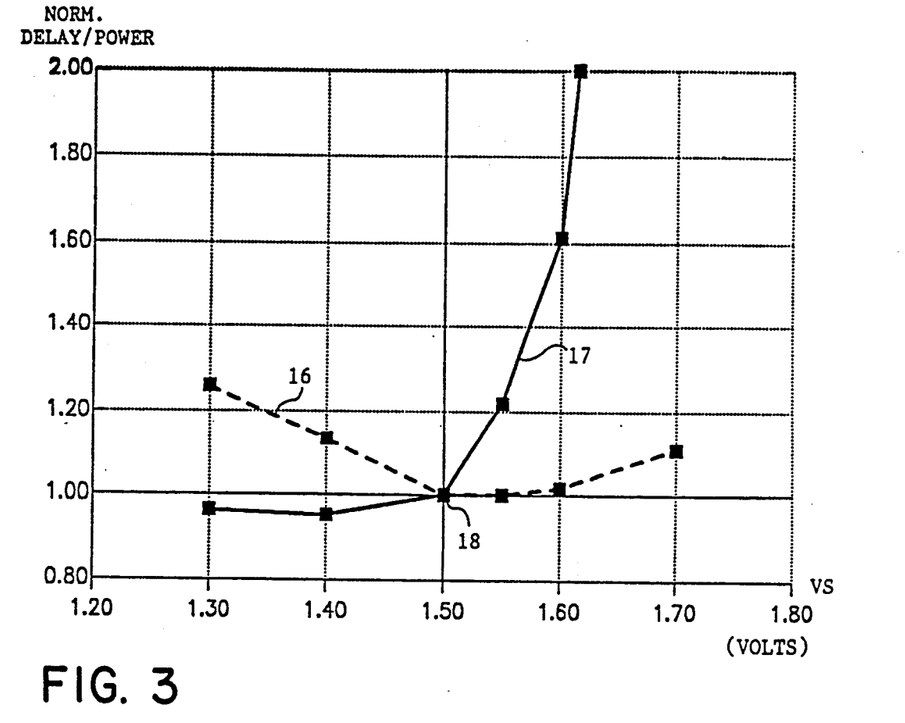
FIG. 3 shows a graph of the normalized delay and power when the voltage between the bases of the output bipolar transistors varies.

FIG. 3 shows the respective variations of said normalized (or relative) delay (curve 16) and power (curve 17) versus said reference voltage shift VS. VS is the difference of potentials between the base nodes B1 and B2 of the output bipolar transistors T1 and T2. Curves 16 and 17 are obtained by connecting an ideal voltage generator (null internal resistance) between the base nodes, and varying its nominal value in the 1.20–1.80 V range. It is clear from curve 16 of FIG. 3, that the delay of CEF driver decreases to a minimum when the reference voltage goes from 1.3 V to 1.7 V and that this minimum is between 1.5 V and 1.6 V. When the voltage shift exceeds this value of 1.5 V, curve 17 demonstrates that the cross-over current ICO, which flows through the NPN and PNP transistors of the CEF driver during the transitions, increases significantly in the AC mode. This cross-over current (that also exists in the quiescent state) increases drastically the power dissipation of the BICMOS circuit 10'.

From FIG. 3, it is clear that the optimized value for VS is about 1.5 V. This value appears to offer the best compromise in terms of delay-power product as indicated by point 18 that belongs to curves 16 and 17. Let us consider the operating points of the previously mentioned solutions. In Ref. 3, VS can easily exceed two VBEs in the transients causing thereby a very high cross-over current. In Ref. 2, VS=1.4 V, the circuit is not optimized in terms of speed response, while in Ref. 4, VS=2 VBEs=1,6 V, which is still not acceptable because the cross-over current ICO is too important. It is clear that this threshold of conduction is not appropriate from a power consumption point of view. Output bipolar transistors must therefore be put at a limit of conduction (to increase speed) but not at such a threshold.

Figure 4A:
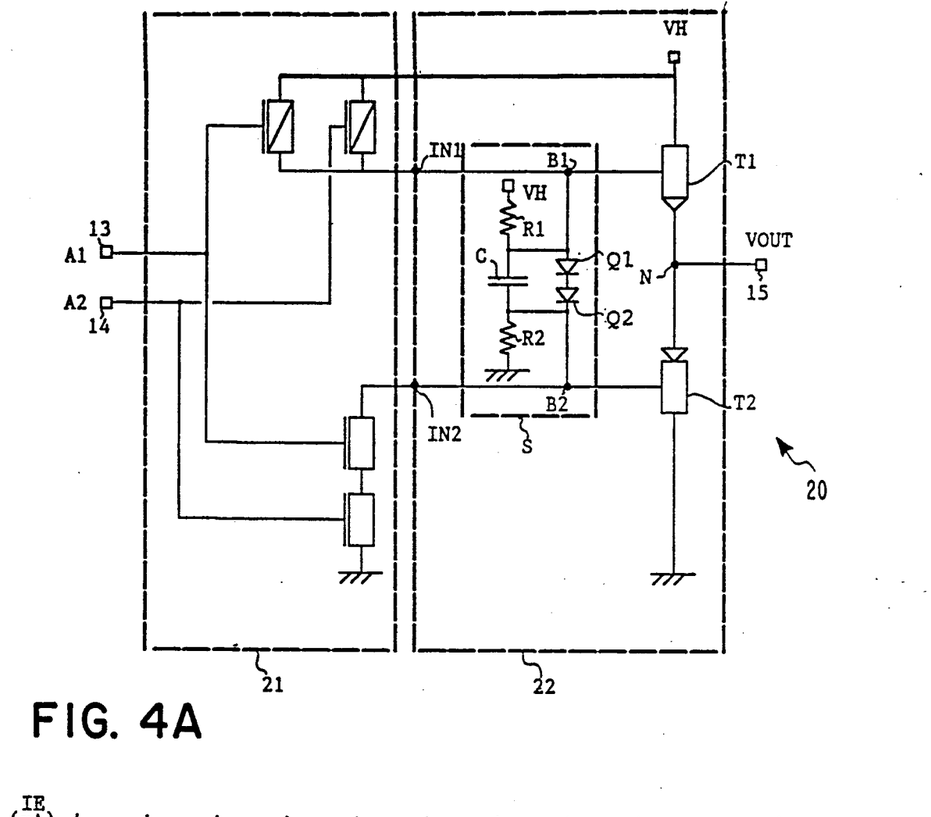
FIG. 4A illustrates the basic concept of the invention, showing in particular the two-diode structure of the improved voltage translator circuit, connected between the base nodes of the output bipolar transistors.

The teachings that derive from FIG. 3 may be applied to the design of an improved BICMOS logic circuit. The schematic of a basic improved circuit is shown in FIG. 4A. If, with conventional transistors, the value of 1.6 V exactly corresponds to two VBEs, 1.5 V corresponds to one VBE plus one (of a certain value ΔV) VBE lower. This optimized value is necessary for a better circuit operation. BICMOS ICL circuit 20, comprising the logic gate block 21 and driving block 22, is still provided with a voltage translator circuit referenced S, placed between the two base nodes B1 and B2 of output bipolar NPN and PNP transistors T1 and T2, as basically done in the prior art circuits.

However, for optimized operation, it is so designed to produce the determined voltage shift VS of about 1.5 V as explained above. In principle, the improved translator circuit essentially consists of two devices Q1, Q2, that are represented in FIG. 4A by two diodes connected in series for sake of simplicity. One diode (e.g. Q1) is obtained from the base-emitter junction of a bipolar transistor, the so-called main transistor, of either the NPN or the PNP type. The voltage drop VD1 across diode Q1 will correspond to the VBE of a bipolar transistor operating normally. There is a special requirement as far as the other diode Q2 is concerned. Diode Q2 must have a lower voltage drop VD2 of an quantity ΔV. There is a real difficulty to obtain different voltage drops if both diodes Q1 and Q2 are connected in series because they would normally carry the same current. The present invention provides an innovative solution to this difficulty through the combination of a diode-connected transistor with the said main transistor, as in a Darlington-like arrangement. Diode Q2 is connected in series in the base of the main transistor, so that it carries the base current, that is smaller than the current flowing through the base-emitter junction of the main bipolar transistor. Consequently, it will exhibit a voltage drop slightly inferior to that OF one VBE, mentioned above. To summarize, the voltage shift VS, that is VS=VD1+VD2=VBE (T1)+VBE (T2), will be such that output transistors T1 and T2 will operate at a certain optimized operating point to ensure both minimal power consumption and delay.

In other words, the translator circuit S biases the base nodes, so that the output transistors T1 and T2 will operate with the cross-over current ICO and with a delay that corresponds to operating point 18 in FIG. 3.

Figure 4B:
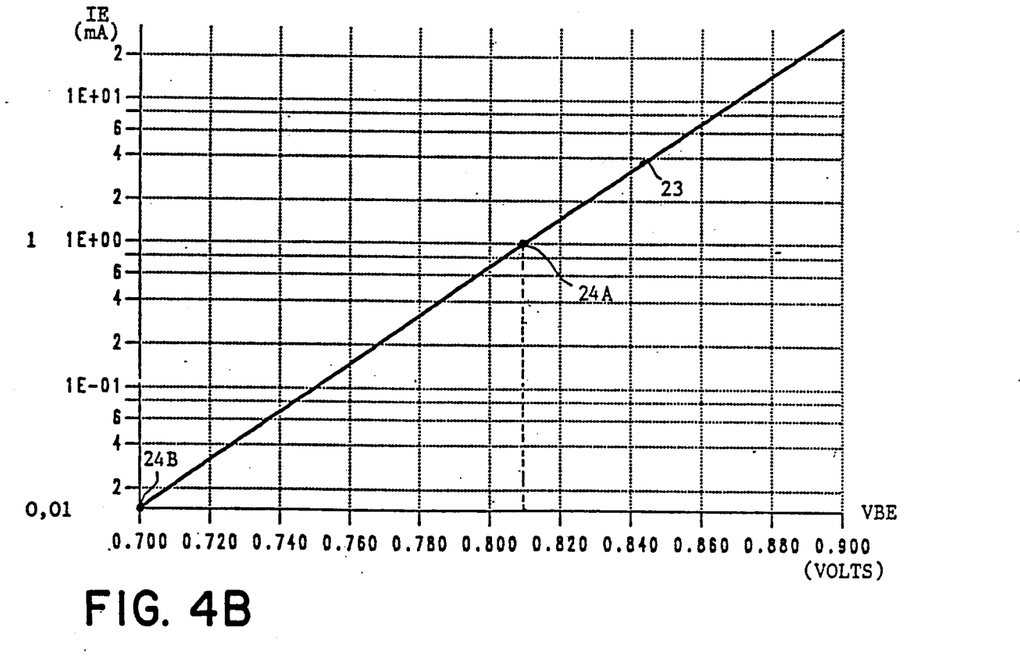
FIG. 4B shows the IE-VBE curve of a diode formed by a PN junction used therein.

This can be best understood from FIG. 4B that shows the typical IE-VBE curve referenced 23 of a diode consisting of a PN junction, e.g. the base-emitter junction of a NPN transistor. As known, the voltage drop VBE across the junction is dependent on the current IE flowing through the junction. In the typical example of FIG. 4B, two diodes Q1 and Q2 operating respectively at points 24A (IE1=1 mA) and 24B (IE2=0.01 mA), exhibit a current ratio of 100 and respective voltage drops VD1=0.81 V and VD2=0.70 V. In this case, ΔV=110 mV.

Note that the best tracking of output bipolar transistors T1 and T2, is obtained, when devices Q1 and Q2 are implemented from the emitter-base junctions of complementary pair of NPN and PNP transistors.

In addition, in the proposed circuit 20 of FIG. 4A, high value resistances R1 and R2 have been added to accurately maintain the voltage shift VS at 1.5 V. This allows the FETS of block 21 to have a maximum drain-source voltage of VH-VS and not VH alone, as in FIG. 1A, this further permits a good scaling down of the FETs and to improve reliability. Finally, although the circuit 20 operates under supply voltage VH, due to the presence of resistances R1 and R2, the voltage swing at the base nodes is reduced to VH-VS, therefore ensuring a very low power dissipation to circuit 20. The function of these resistors can be explained. The speed sensitivity of the ICL circuit 20 to capacitances on the base nodes of the bipolar transistor is very high. These capacitances with one node to GND or to VH must be reduced as much as possible. This is achieved with the present implementation of the circuit of FIG. 4A. Resistively connected FETs are connected in parallel with the FETs of the logic gate block. The drain diffusion area can be reduced as these FETs can be integrated in the base of the PNP transistor for the NFETs and the base of the NPN transistor for the PFETs.

The voltage translator circuit S must have an impedance as low as possible to allow the two bases to switch at the same time, for efficient DC and AC operation. In AC mode, this can be achieved with the help of a capacitance Cl connected between the two base nodes B1 and B2, which reduces dynamic impedance. This capacitance C, the value of which must be selected as high as possible, has a favorable influence to improve circuit performance. Logic input signals supplied by logic gate block 21 and applied to base nodes B1 and B2 of the driving block 22 are respectively referenced IN1 and IN2.

In conjunction with FIGS. 5 and 6, different implementations of the above concept of the present invention (as illustrated in FIGS. 4A and 4B) are given below, in the BICMOS environment.

Figure 5:
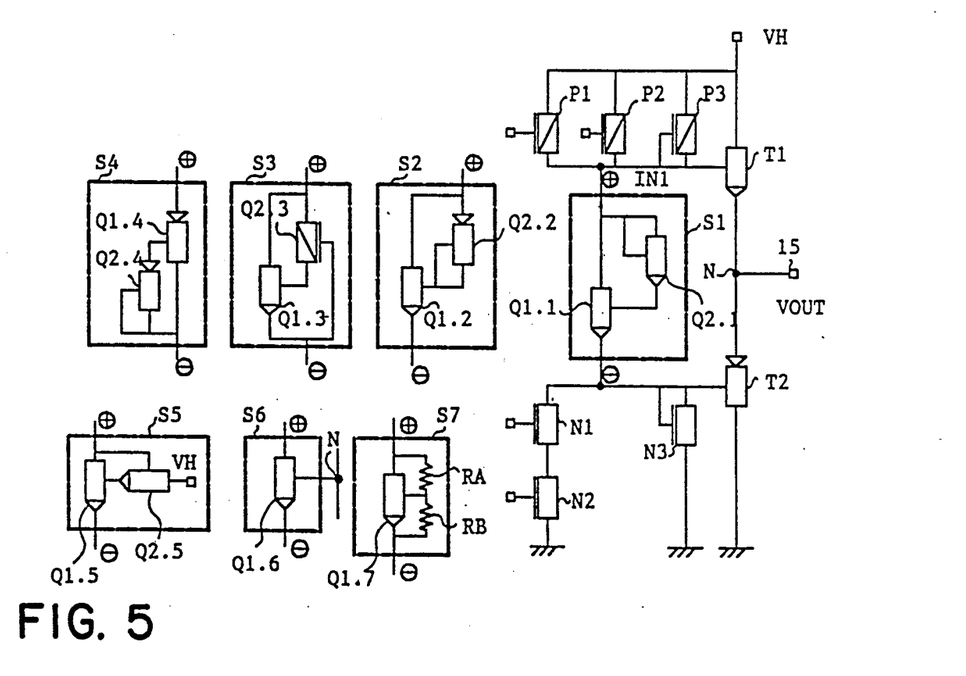
FIG. 5 illustrates a first embodiment of the voltage translator circuit of the present invention, built with a main bipolar transistor connected between the base nodes of the output bipolar transistors according to different variants.

Now turning to FIG. 5, there is shown a first embodiment of the voltage translator circuit of the present invention showing different variants of implementation. Basically, the optimized voltage shift VS can be obtained with two transistors connected in in various Darlington like arrangements. A first variant thereof is referenced S1 in FIG. 5. The current crossing PFETs Pl to P3 goes through main transistor Q1.1 and only a base current goes through diode-connected transistor Q2.1. As a result, voltage shift VS is equal to two VBE of NPN transistors. But, VBE (Q2.1) is theoretically about 100 mV below VBE (Q1.1), because the current flowing through the main transistor IE, say (Q1.1) is divided by a beta of 80 in transistor Q2.1, in other words IE (Q2.1)=IB (Q1.1)=IE (Q1.1)/$\beta$.

Resistances R1 and R2 can be made with NFETs and PFETs. As shown in FIG. 5, R1 and R2 are respectively implemented with PFET P3 and NFET N3, connected in a resistor configuration. It is preferred that the FETs (P3, N3) operating as resistors have a higher voltage threshold than the other FETs (P1, ..., N1, ...) of the logic block which have VTs of 0.9 V, to be compatible with reduced signal swing. Such higher threshold voltages result in a silicon area as well in power dissipation savings.

The voltage translator circuit S can also be built with other Darlington configurations of NPN and PNP transistors or a mix of them. In variant S2, the diodes are made of a NPN transistor, as the main transistor, and an isolated PNP transistor shunting the base-collector junction of the main transistor. This implementation is by far an excellent solution, since it gives always good tracking between the VBEs of the NPN/PNP output bipolar transistors T1 and T2 of the driving stage and the NPN/PNP pair of transistors Q1.2 and Q2.2 of the translator voltage circuit.

A voltage translator circuit S with a voltage threshold of a PFET, VT=-0.9 V can also be built with a low impedance as shown in variant S3 of FIG. 5. In this variant, VS equals the voltage threshold VT that is defined between the collector and the emitter of the NPN main transistor Q1.3. In a similar variant, a FET with a lower VT, e.g. VT=0.7 V, gate and drain of which are shorted, is connected to the base of Q1.3. In this case, VS=VBE (Q1.3)+VT=-1.5 V. It can be noticed that it is very easy to integrate this PFET Q2.3 in the base region of the NPN transistor Q1.3. The resulting integrated device has still a low impedance due to the beta between the total current and the current in the PFET.

As to variant S4, the arrangement of the two collector isolated PNPs Q1.4 and Q2.4 is made possible if a P well can be built in an N well. In this case, the silicon area is reduced as the PNPs can be integrated in the N well directly.

The Darlington structure can be arranged differently according to variant S5. This implementation of the voltage translator circuit results in the lowest possible capacitance on the base of the main NPN transistor Q1.5 and gives one of the fastest circuits of the whole improved BICMOS ICL family. The current flowing in the NPN transistor Q2.5, is beta times smaller than the current in the main transistor Q1.5. This current flowing through Q2.5 has a negligible effect on the total current supplied by the power supply that supplies the first supply voltage VH. Collector of transistor Q2.5 is connected to VH. Transistor Q2.5 may be integrated with transistor T1 to form a single transistor with a double emitter to improve density.

Still another variant, based on the use of a simplified Darlington structure, in the voltage translator circuit S can be implemented. In this variant, referenced S6, only one NPN transistor Q1.6 is used. Main transistor Q1.6 has the collector and the emitter connected to the base nodes B1 and B2 of the NPN and PNP transistors respectively, while the base is connected to the output node N. This implementation is similar to S1, the emitter-base junction of output transistor T1 plays the role of diode-connected transistor Q2.1. The speed of such a circuit is improved, but the reduction of the voltage across the PFETS in the logic gate block is no longer guaranteed. This is due to the fact that transistor Q1.6 has a strong current during the falling transition which in turn, pulls down too rapidly the base of top NPN transistor T1.

According to still another variant referenced S7, the base of main transistor Q1.7 is connected to a resistive bridge comprised of resistors RA and RB placed between base nodes B1 and B2. S7 operates like a voltage multiplier circuit and RA plays a role equivalent to a diode.

It is to be noted that in most of all the above variants (S1 to S5), there is main transistor, that has first and second electrodes connected to base nodes of output transistor T1 and T2, one junction (base-emitter or base-collector) thereof is shunted by a diode-connected transistor that is connected to the third or control electrode. The main transistor and the diode-connected transistor broadly correspond to devices Q1 and Q2, mentioned above, and are of generic use in all the variants.

Figure 6:
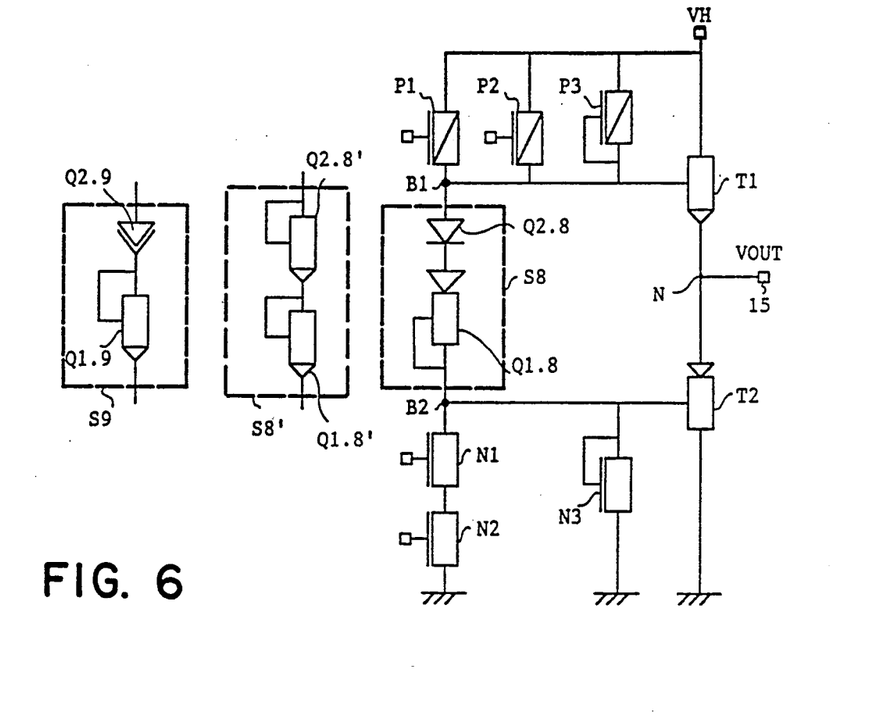
FIG. 6 illustrates a second embodiment of the voltage translator circuit of the present invention built with two diodes connected in series, according to different variants.

In FIG. 6, there are three double diode implementations referenced S8, S8', and S9 of the translator voltage circuit S. Circuit S8 is comprised of a diode Q2.8 built from a PN diode or a diode-connected NPN transistor connected in series with a diode-connected PNP transistor Q1.1. A diode-connected NPN transistor could be used instead of the diode-connected PNP transistor because VBE(NPN) § VBE(PNP), but the optimal tracking would no longer be obtained. This variant is referred to as S8'. In still another variant referenced S9, a schottky diode Q2.9 (when the manufacturing process permits it), can be used advantageously to replace the PN diode Q2.8, because it gives better device integration and an improved speed*power product from a design point of view. However, none of these full diode implementations is satisfactory. It is not possible today to reach the desired optimized value for VS except when a special metallurgy is used to make the SBD, in order to provide the desired forward voltage VF=0.7 V. It is to be noted that these implementations can be differentiated from the prior references showing two diodes in series in the translator circuit. In Refs. 2 and 4, one of the diodes is obtained from a transistor connected in an EF configuration and, if the disclosed implementations are suitable in pure bipolar complementary environment, they do not properly operate in BICMOS environment as explained above. In Ref. 3, the PFET device (P' in FIG. 1B) connected between the base nodes has a complex impedance. It is equivalent to a diode in series with a high resistance, as it operates with a low voltage on the gate. When implemented with such a device, the driver can produce high crossover current. As a fact, none of them have recognized the existence of an optimized value for VS of about 1.5 V.

Figure 7:
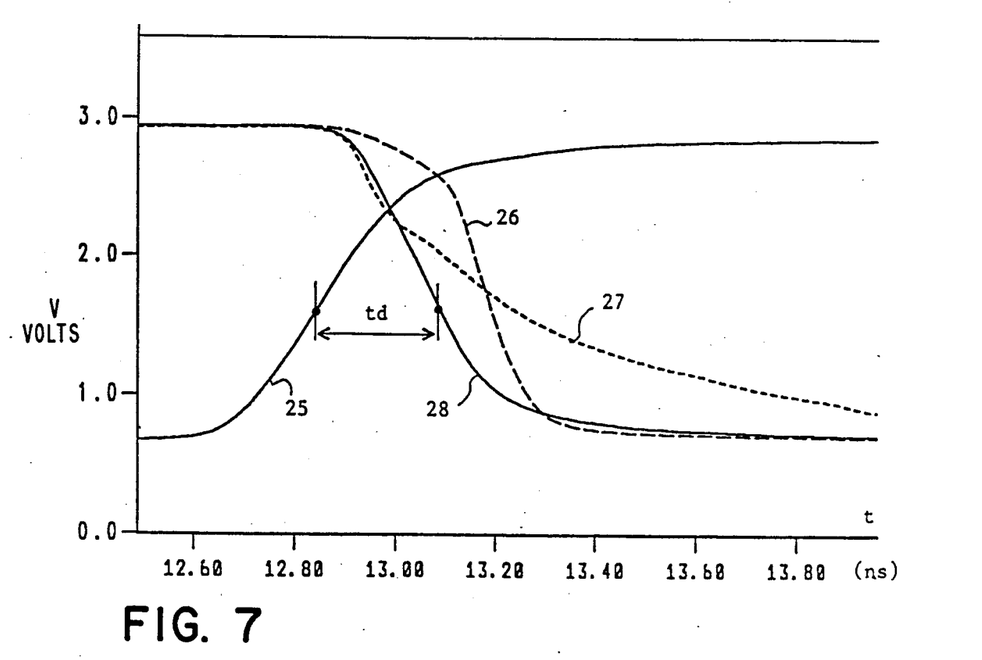
FIG. 7 illustrates typical waveforms of input/output signals obtained from BICMOS ICL circuits of FIGS. 1A, 1B, and one circuit variant of FIG. 5.

FIG. 7 shows typical waveforms of the output signal VOUT obtained in different circuits from an identical up going transition signal (that corresponds to the logic signal that is applied to base node B1) represented by curve 25. Curves 26, 27 and 28 show the output signal VOUT available at terminal 15 for the various circuits of FIGS. 1A, 1B and circuit variant S5 of FIG. 5 respectively. It is apparent from curve 28, that the translator circuit of the present invention provides the optimal results in terms of delays.

Figure 8:
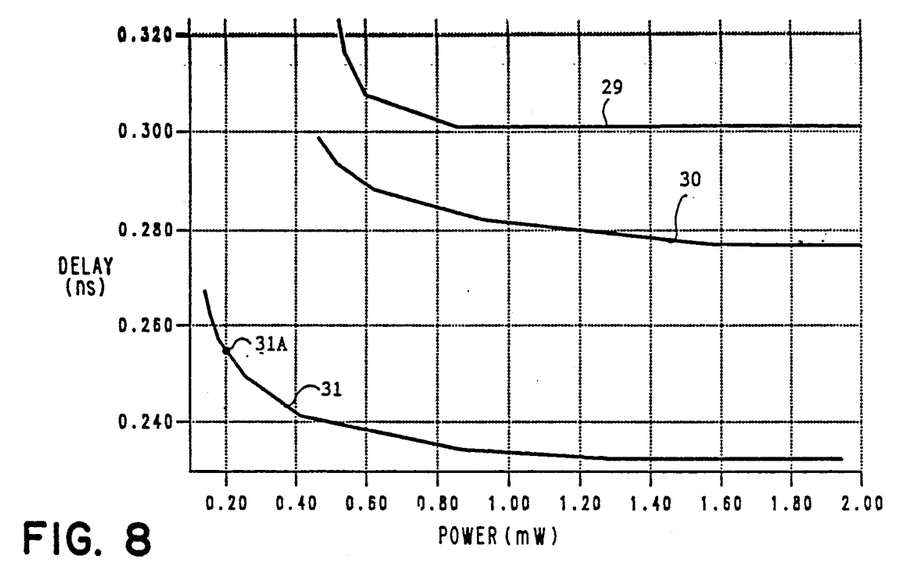
FIG. 8 illustrates a comparison of typical delay vs power curves for BICMOS ICL circuits of FIG. 1B and one circuit variant of FIGS. 5 and 6.

FIG. 8 shows the delay versus power curves when varying the DC bias current in the translator voltage circuit. Curves 29 and 30 show the respective curves for the translator voltage circuits of FIGS. 1B (S') and 6 (variant S8'). Curve 31 shows the curve obtained with variant S5 of FIG. 5. The best DC bias may be adjusted through values of resistors R1 and R2, say with the size of devices P3 and N3 in FIG. 5. At point 31A, the dissipated power is Pd=0.2 mW and the corresponding delay is 0.26 ns which correlates the delay td depicted in FIG. 7.

In the CMOS-environment, the proposed translator voltage circuit is aimed for submicron technology, while avoiding the various problems attached to short channel FETs, as the punch-through and hot electron effects. In CMOS, to have submicron FETs working with short channel length, it is necessary to scale down the power supply, thus lowering the benefits which result of the channel length scaling down.

Although the different embodiments of the translator voltage circuit in a complementary emitter follower driver have been given in a CMOS environment, the following example will demonstrate that other circuits, such as ECL, maybe used as well.

Figure 9:
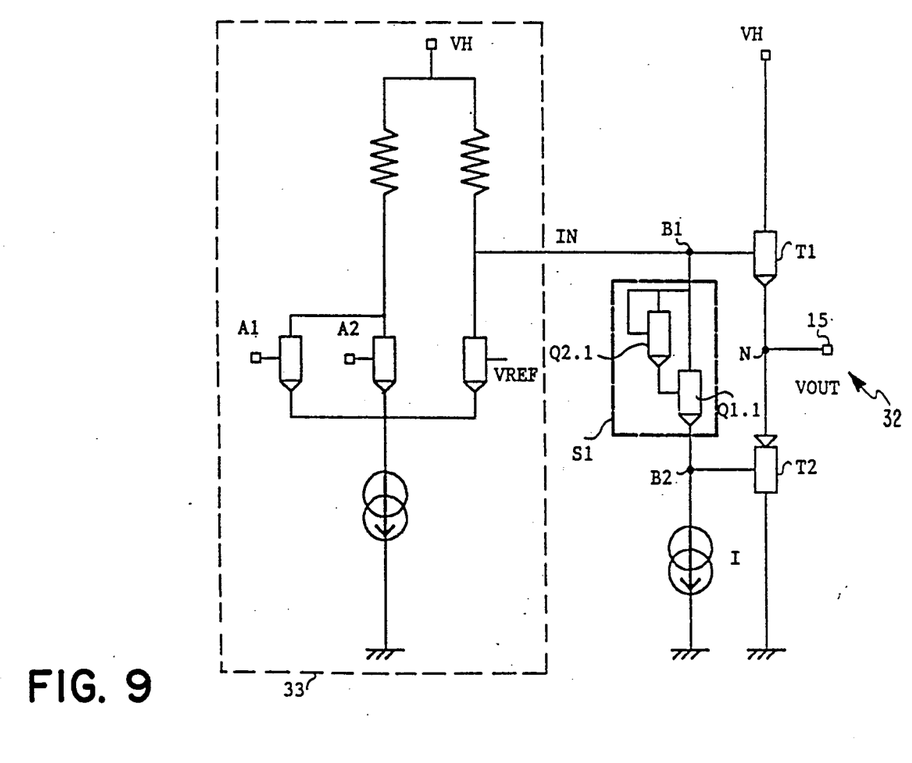
FIG. 9 illustrates one variant of the translator voltage circuit of FIG. 5 when implemented in an ECL environment.

FIG. 9 shows how the present invention described in the BICMOS ICL environment, can directly be applied to the ECL environment. The ECL circuit 32 is comprised of a logic ECL gate 33 driving a CEF driver comprised of output bipolar transistors T1 and T2. The driver is provided with the translator voltage circuit S1 of FIG. 5. The logic signal applied to the base node B1 of transistor T1 is referenced IN. The other base node B2 is connected to a current source I, and is driven by logic signal IN through NPN transistors Q1.1 and Q2.1 connected in a Darlington configuration.

We claim:

1. A CEF driver (22) of the kind comprising a top NPN (T1) and a bottom PNP (T2) output bipolar transistors connected respectively to a first supply voltage (VH) and a second supply voltage (GND) with a common output node (N) connected therebetween; a terminal (15) being connected to the said output node (N) where the output signal (VOUT) is available; a translator voltage circuit (S) placed between the base nodes (B1, B2) of the said respective bipolar output transistors; the said base nodes being driven by respective logic signals (IN1, IN2) supplied by a preceding driving circuit (21), characterized in that said translator voltage circuit (S) includes diode means (Q1, Q2) to ensure that the voltage shift VS that exists between the base nodes (B1, B2) of the said bipolar output transistors (T1, T2) places the said output transistors at an operating point (18, FIG. 3) that provides optimized operation of the said output transistors, at a minimum relative power and relative delay.

2. A CEF driver according to claim 1 wherein the said diode means comprises a first device (Q1) having a voltage drop (VD1) corresponding to a normal VBE of a bipolar transistor and a second device (Q2) having a voltage drop (VD2) inferior of quantity $\Delta V$.

3. A CEF driver according to claim 1 wherein the said voltage shift VS is about 1.5 V, and $\Delta V$ is about 100 m.

4. A CEF driver according to claim 1 wherein the said diode means comprises a main bipolar transistor (Q1) having first and second electrodes respectively connected to the said base nodes and a diode connected transistor (Q2) connected between its control electrode and one of the said first and second electrodes, so that the current flowing through the said diode-connected transistor (Q2) is beta times smaller than the current flowing in the main transistor (Q1).

5. A CEF driver according to claim 4 wherein the said main bipolar transistor (Q1) is of the NPN type, having its collector electrode connected to the base node of the top NPN output transistor (T1), and its emitter electrode connected to the base node of the bottom PNP output transistor (T2).

6. A CEF driver according to claim 5 wherein the said diode-connected transistor (Q2.1) is of the NPN type and shorts the base-collector junction of the said main NPN transistor (Q1.1), according to configuration S1.

7. A CEF driver according to claim 5 wherein the said diode-connected transistor (Q2.2) is of the PNP type and shorts the base-collector junction of the main NPN transistor (Q1.2), according to configuration S2.

8. A CEF driver according to claim 5 wherein the said diode-connected transistor (Q2.3) is of the FET type and shorts the collector-base base junction of the main NPN transistor (Q1.3), according to configuration S3.

9. A CEF driver according to claim 5 wherein the said diode-connected transistor (Q2.5) is of the NPN type with its collector electrode connected to the said first supply voltage (VH) and its emitter and base electrodes respectively connected to the base and collector electrodes of the main NPN transistor (Q1.5), according to configuration S5.

10. A CEF driver according to claim 9, wherein the said transistors Q2.5 and T1 are integrated to form a double-emitter single transistor.

11. A CEF driver according to claim 4 wherein the said main bipolar transistor (Q1.4) is of the PNP type having its collector electrode connected to the base node of the bottom PNP output transistor (T2) and its emitter electrode connected to the base node of the top NPN output transistor (T1), and the said diode-connected transistor (Q2.4) is of the PNP type and shorts the base-emitter junction of the said main bipolar transistor, according to configuration S4.

12. A CEF driver according to claim 1 wherein the said diode means comprises one NPN transistor, the base electrode of which is connected to a potential determined from a resistor bridge (RA, RB) connected between said base nodes.

13. A CEF driver according to claim 1 wherein the said diode means comprises a NPN transistor, the base electrode of which is connected to the common output node (N).

14. A CEF driver according to claim 1 wherein a capacitor (C) is connected between the said base nodes.

15. A CEF driver according to claim 1 wherein a resistance (R1) is connected between the said base node (B1) of the top NPN transistors and the first supply voltage (VH).

16. A CEF driver according to claim 1 wherein a resistance (R2) is connected between the said base node (B2) of the bottom PNP transistor and the second supply voltage (GND).

17. A CEF driver according to claim 1 wherein the said driving circuit is a CMOS logic gate supplying logic signals (IN1, IN2) to the respective base node (B1, B2) of the NPN and PNP output bipolar transistors (T1, T2).

18. A CEF driver according to claim 1 wherein the said driving circuit is an ECL circuit supplying a logic signal (IN) to the base node of the top NPN transistor; the base node of the PNP transistor is connected to a current source (I) and is driven by the said logic signal through the said translator voltage circuit.

* * * * *

REEXAMINATION CERTIFICATE (2032nd)

United States Patent [19]
Boudon et al.

[11] B1 5,023,478
[45] Certificate Issued Jun. 1, 1993

[54] COMPLEMENTARY EMITTER FOLLOWER DRIVERS

[75] Inventors: Gerard Boudon, Mennecy; Pierre Mollier, Boissise Le Roi, both of France; Seiki Ogura, Hopewell Junction, N.Y.; Dominique Omet, Evry, France; Pascal Tannhof, Perthes, France; Franck Wallart, Cesson, France

[73] Assignee: International Business Machines Corporation, Armonk, N.Y.

Reexamination Request:
No. 90/002,581, Feb. 12, 1992

Reexamination Certificate for:
Patent No.: 5,023,478
Issued: Jun. 11, 1991
Appl. No.: 493,079
Filed: Mar. 13, 1990

[30] Foreign Application Priority Data

Mar. 14, 1989 [EP] European Pat. Off. ......... 89480046.5

[51] Int. Cl.⁵ ............... H03K 19/092; H03K 19/013; H03K 19/017; H03K 19/086
[52] U.S. Cl. ............................ 307/446; 307/455; 307/456; 307/475; 307/544; 307/255; 307/443; 307/558; 307/547
[58] Field of Search ............... 307/443, 446, 455, 456, 307/475, 542, 544, 551, 565, 567, 570, 255, 270

[56] References Cited

U.S. PATENT DOCUMENTS

| | | | |
|---|---|---|---|
| 3,864,584 | 2/1975 | Hutson | 307/263 |
| 3,866,063 | 2/1975 | Long | 307/260 |
| 4,289,978 | 9/1981 | Konian et al. | 307/455 |
| 4,308,469 | 12/1981 | Cavaliere et al. | 307/455 |
| 4,618,782 | 10/1986 | Lang et al. | 307/255 |
| 4,665,547 | 5/1987 | Tuhy, Jr. | 307/567 |
| 4,818,893 | 4/1989 | Domnitz | 307/254 |
| 4,845,385 | 7/1989 | Ruth, Jr. | 307/446 |
| 4,945,262 | 7/1990 | Piasecki | 307/451 |
| 4,948,994 | 8/1990 | Akioka et al. | 307/570 |
| 4,980,582 | 12/1990 | Waller et al. | 307/455 |

FOREIGN PATENT DOCUMENTS

| | | | |
|---|---|---|---|
| 0208712 | 9/1987 | Japan | 307/570 |
| 0171022 | 7/1988 | Japan | 307/455 |
| 0057014 | 2/1990 | Japan | 307/455 |
| 0576660 | 10/1977 | U.S.S.R. | 307/255 |

*Primary Examiner*—Timothy P. Callahan

[57] ABSTRACT

The present invention relates to fast complementary emitter follower drivers/buffers to be used in either a CMOS or pure complementary bipolar environment. The output driver (22) comprises top NPN and bottom PNP output transistors (T1, T2) with a common output node (N) connected therebetween. A terminal (15) is connected to the said output node (N) where the output signal (VOUT) is available. The pair of bipolar output transistors is biased between the first and second supply voltages (VH, GND). The output driver is provided with a voltage translator circuit (S) connected between the base nodes (B1, B2) of the output transistors (T1, T2). Logic signals (IN1, IN2), supplied by a preceding driving circuit (21), are applied to said base nodes. According to the invention, the voltage translator circuit (S) comprises two diodes (D1, D2) connected in series, preferably implemented with a main bipolar transistor having a junction shorted by a diode connected transistor to form a Darlington-like configuration. As a result, the voltage shift VS between the base nodes is selected to have the said output transistors operating at an operating point which ensures minimum delay and power consumption. In a typical bipolar technology, VS is made to be approximately equal to 1.5V. Additional features comprise the connection of a capacitor (C) between the base nodes and resistances (R1, R2) to the base nodes. The preceding driving circuit may be a CMOS logic gate or an ECL logic circuit.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 3, lines 25-47:

Still another solution in the ECL environment is shown in Ref. 4: U.S. [patent application No. 308,469] *Pat. No. 4,308,469* assigned to the same assignee as of the present invention. The circuit referenced 10".2 shown in FIG. 2B of the present application is extracted from said Ref. 4. As far as the CEF driver 12".2 is concerned, two differences may be noticed. Firstly, the single logic signal IN is applied to the bases of the bottom transistor T2 and of transistor T'".2, in a similar but symmetric operation, when compared to circuit 12".1 of FIG. 2A. Secondly, a diode connected transistor D".2 is used instead of the SBD D".1. In operation, the D.C. offset of two VBEs provided between the bases of transistors D"2 and T"2 match the corresponding offset required between the bases of transistors T1 and T2. Accordingly, the quiescent voltage at the emitters of the input transistor pair is set so that transistors T1 and T2 are simultaneously placed at such a threshold of conduction that a very high cross-over current ICO is produced, as demonstrated later. However, due to the presence of a diode connected NPN transistor in series with the base-emitter junction of a PNP transistor, the tracking is excellent.

Column 7, lines 21-32:

The voltage translator circuit S must have an impedance as low as possible to allow the two bases to switch at the same time, for efficient DC and AC operation. In AC mode, this can be achieved with the help of a capacitance [C1] *C* connected between the two base nodes B1 and B2, which reduces dynamic impedance. This capacitance C, the value of which must be selected as high as possible, has a favorable influence to improve circuit performance. Logic input signals supplied by logic gate block 21 and applied to base nodes B1 and B2 of the driving block 22 are respectively referenced IN1 and IN2.

Column 7, lines 37-51:

Now turning to FIG. 5, there is shown a first embodiment of the voltage transistor circuit of the present invention showing different variants of implementation. Basically, the optimized voltage shift VS can be obtained with two transistors connected in in various Darlington arrangements. A first variant thereof is referenced S1 in FIG. 5, *the S1 configuration*. The current crossing PFETs P1 to P3 goes through main transistor Q1.1 and only a base current goes through diode-connected transistor Q2.1. As a result, voltage shift VS is equal to two VBE of NPN transistors. But, VBE (Q2.1) is theoretically about 100 mV below VBE (Q1.1), because the current flowing through the main transistor IE, say (Q1.1) is divided by a beta of 80 in transistor Q2.1, in other words $IE(Q2.1) = IB(Q1.1) = IE(Q1.1)/\beta$.

Column 7, lines 62-68 and Column 8, lines 1-4:

The voltage translator circuit S can also be built with other Darlington configurations of NPN and PNP transistors or a mix of them. In variant S2, *the S2 configuration*, the diodes are made of a NPN transistor, as the main transistor, and an isolated PNP transistor shunting the base-collector junction of the main transistor. This implementation is by far an excellent solution, since it gives always good tracking between the VBEs of the NPN/PNP output bipolar transistors T1 and T2 of the driving stage and the NPN/PNP pair of transistors Q1.2 and Q2.2 of the translator voltage circuit.

Column 8, lines 5-18:

A voltage translator circuit S with a voltage threshold of a PFET, $VT = -0.9$ V can also be built with a low impedance as shown in variant S3 of FIG. 5, *the S3 configuration*. In this variant, VS equals the voltage threshold VT that is defined between the collector and the emitter of the NPN main transistor Q1.3. In a similar variant, a FET with a lower VT, e.g. $VT = 0.7$ V, gate and drain of which are shorted, is connected to the base of Q1.3. In this case, $VS = VBE(Q1.3) + VT = -1.5$ V. It can be noticed that it is very easy to integrate this PFET Q2.3 in the base region of the NPN transistor Q1.3. The resulting integrated device has still a low impedance due to the beta between the total current and the current in the PFET.

Column 8, lines 19-23:

As to variant S4, *the S4 configuration*, the arrangement of the two collector isolated PNPs Q1.4 and Q2.4 is made possible if a P well can be built in an N well. In this case, the silicon area is reduced as the PNPs can be integrated in the N well directly.

Column 8, lines 24-37:

The Darlington structure can be arranged differently according to variant S5, *the S5 configuration*. This implementation of the voltage translator circuit results in the lowest possible capacitance on the base of the main NPN transistor Q1.5 and gives one of the fastest circuits of the whole improved BICMOS ICL family. The current flowing in the NPN transistor Q2.5 has a negligible effect on the total current supplied by the power supply that supplies the first supply voltage VH. Collector of transistor Q2.5 is connected to VH. Transistor Q2.5 may be integrated with transistor T1 to form a single transistor with a double emitter to improve density.

Column 8, lines 38-53:

Still another variant, based on the use of a simplified Darlington Structure, in the voltage translator circuit S can be implemented. In this variant, [referenced] *the* S6 *configuration*, only one NPN transistor Q1.6 is used. Main transistor Q1.6 has the collector and the emitter connected to the base nodes B1 and B2 of the NPN and PNP transistors respectively, while the base is connected to the output node N. This implementation is similar to S1, the emitter-base junction of output transistor T1 plays the role of diode-connected transistor Q2.1. The speed of such a circuit is improved, but the reduction of the voltage across the PFETS in the logic gate block is no longer guaranteed. This is due to the fact that transistor Q1.6 has a strong current during the falling transition which in turn, pulls down too rapidly the base of top NPN transistor T1.

Column 8, lines 54–59:

According to still another variant [referenced] S7, the S7 configuration, the base of main transistor Q1.7 is connected to a resistive bridge comprised of resistors RA and RB placed between base nodes B1 and B2. S7 operates like a voltage multiplier circuit and RA plays a role equivalent to a diode.

Column 9, lines 1–35:

In FIG. 6, there are three double diode implementations referenced S8, S8', and S9 of the translator voltage circuit S. [Circuit] The S8 configuration is comprised of a diode Q2.8 built from a PN diode or a diode-connected NPN transistor connected in series with a diode-connected PNP transistor Q1.1. A diode-connected NPN transistor could be used instead of the diode-connected PNP transistor because VBE(NPN) § VBE(PNP), but the optimal tracking would no longer be obtained. This variant is referred to as the S8' configuration. In still another variant [referenced] S9, the S9 configuration, a Schottky diode Q2.9 (when the manufacturing process permits it), can be used advantageously to replace the PN diode Q2.8, because it gives better device integration and an improved speed*power product from a design point of view. However, none of these full diode implementations is satisfactory. It is not possible today to reach the desired optimized value for VS except when a special metallurgy is used to make the SBD, in order to provide the desired forward voltage $VF = 0.7$ V. It is to be noted that these implementations can be differentiated from the prior references showing two diodes in series in the translator circuit. In Refs. 2 and 4, one of the diodes is obtained from a transistor connected in an EF configuration and, if the disclosed implementations are suitable in pure bipolar complementary environment, they do not properly operate in BICMOS environment as explained above. In Ref. 3, the PFET device (P' in FIG. 1B) connected between the base nodes has a complex impedance. It is equivalent to a diode in series with a high resistance, as it operates with a low voltage on the gate. When implemented with such a device, the driver can produce high cross-over current. As a fact, none of them have recognized the existence of an optimized value for VS of about 1.5 V.

AS A RESULT OF REEXAMINATION, IT HAS BEEN DETERMINED THAT:

Claims 1–3, 12 and 14–18 are cancelled.

Claims 4–9, 11 and 13 are determined to be patentable as amended.

Claim 10, dependent on an amended claim, is determined to be patentable.

4. A CEF driver [according to claim 1] of the kind comprising a top NPN (T1) and a bottom PNP (T2) output bipolar transistors connected respectively to a first supply voltage (VH) and a second supply voltage (GND) with a common output node (N) connected therebetween; a terminal (15) being connected to said output node (N) where an output signal (VOUT) is available; a translator voltage circuit (S) between the bases (B1, B2) of the respective bipolar output transistors; said bases being driven by respective logic signals (IN1, IN2) supplied by a preceding driving circuit (21), characterized in that said translator voltage circuit (S) includes diode means (Q1, Q2) to ensure that the voltage shift VS that exists between the bases (B1, B2) of said bipolar output transistors (T1, T2) places said output transistors at an operating point (18, FIG. 3) that provides optimized operation of the said output transistors, at a minimum relative power and relative delay; wherein the said diode means comprises a main bipolar transistor (Q1) having first and second electrodes respectively connected to [the] said [base nodes] output transistor bases and a diode connected transistor (Q2) connected between its control electrode and one of the said first and second electrodes, so that [the] a current flowing through the said diode-connected transistor (Q2) is beta times smaller than [the] a current flowing in the main transistor (Q1).

5. A CEF driver according to claim 4 wherein the said main bipolar transistor (Q1) is of the NPN type, having its collector electrode connected to the base [node] of the top NPN output transistor (T1), and its emitter electrode connected to the base [node] of the bottom PNP output transistor (T2).

6. A CEF driver according to claim 5 wherein the said diode-connected transistor (Q2.1) is of the NPN type and shorts the base-collector junction of the said main NPN transistor (Q1.1)[, according to configuration S1].

7. A CEF driver according to claim 5 wherein the said diode-connected transistor (Q2.2) is of the PNP type and shorts the base-collector junction of the main NPN transistor (Q1.2)[, according to configuration S2].

8. A CEF driver according to claim 5 wherein the said diode-connected transistor (Q2.3) is of the FET type and shorts the collector-base base junction of the main NPN transistor (Q1.3)[, according to configuration S3].

9. A CEF driver according to claim 5 wherein the said diode-connected transistor (Q2.5) is of the NPN type with its collector electrode connected to the said first supply voltage (VH) and its emitter and base electrodes respectively connected to the base and collector electrodes of the main NPN transistor (Q1.5)[, according to configuration S5].

11. A CEF driver according to claim 4 wherein the said main bipolar transistor (Q1.4) is of the PNP type having its collector electrode connected to the base node of the bottom PNP output transistor (T2) and its emitter electrode connected to the base node of the top NPN output transistor (T1), and the said diode-connected transistor (Q2.4) is of the PNP type and shorts the base-emitter junction of the said main bipolar transistor[, according to configuration S4].

13. A CEF driver [according to claim 1] of the kind comprising a top NPN (T1) and a bottom PNP (T2) output bipolar transistors connected respectively to a first supply voltage (VH) and a second supply voltage (GND) with a common output node (N) connected there between; a terminal (15) being connected to said output node (N) where an output signal (VOUT) is available; a translator voltage circuit (S) between the bases (B1, B2) of the respective bipolar output transistors; said bases being driven by respective logic signals (IN1, IN2) supplied by a preceding driving circuit (21), characterized in that said translator voltage circuit (S) includes diode means (Q1, Q2) to ensure that the voltage shift VS that exists between the bases (B1, B2) of said bipolar output transistors (T1, T2) places said output transistors at an operating point (18, FIG. 3) that provides optimized operation of the said output transistors, at a minimum relative power and relative delay; wherein the said diode means comprises a NPN transistor, the base [electrode] of which is connected to the common output node (N).

* * * * *